(12) United States Patent
Saggio et al.

(10) Patent No.: US 6,404,010 B2
(45) Date of Patent: Jun. 11, 2002

(54) MOS TECHNOLOGY POWER DEVICE

(75) Inventors: Mario Saggio, Acicastello; Ferruccio Frisina, Sant'Agata Li Battiati; Angelo Magri', Belpasso, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/860,809

(22) Filed: May 17, 2001

(30) Foreign Application Priority Data

May 19, 2000 (EP) ............................................. 00830360

(51) Int. Cl.$^7$ .......................... H01L 29/76; H01L 29/94; H01L 31/113; H01L 31/119
(52) U.S. Cl. ....................................... 257/341; 251/401
(58) Field of Search ................................ 257/336, 337, 257/338, 339, 302, 341, 344, 347, 401, 500

(56) References Cited

U.S. PATENT DOCUMENTS

| | | | |
|---|---|---|---|
| 5,703,383 A | * 12/1997 | Nakayama | 257/139 |
| 5,736,766 A | * 4/1998 | Efland et al. | 257/338 |
| 6,008,518 A | * 12/1999 | Takahashi | 257/326 |
| 6,051,862 A | * 4/2000 | Gramaldi et al. | 257/341 |
| 6,054,737 A | * 4/2000 | Magri et al. | 257/341 |
| 6,291,856 B1 | * 9/2001 | Miyasaka et al. | 257/335 |

FOREIGN PATENT DOCUMENTS

EP 0782201 A1 7/1997
WO WO97/29518 8/1997

OTHER PUBLICATIONS

Deboy, G. et al., "A New Generation of High Voltage MOSFETs Breaks the Limit Line of Silicon," IEDM, Dec. 6–9, 1998, pp. 683–685, XP–00878722.
European Search Report dated Oct. 19, 2000 for European Patent Application No. 00830360.4.

\* cited by examiner

*Primary Examiner*—Olik Chaudhuri
*Assistant Examiner*—Hoai Pham
(74) *Attorney, Agent, or Firm*—Lisa K. Jorgenson; Stephen Bongini; Fleit, Kain, Gibbons, Gutman & Bongini P.L.

(57) ABSTRACT

A MOS technology power device is described which comprises a plurality of elementary active units and a part of said power device which is placed between zones where the elementary active units are formed. The part of the power device comprises at least two heavily doped body regions of a first conductivity type which are formed in a semiconductor layer of a second conductivity type, a first lightly doped semiconductor region of the first conductivity type which is placed laterally between the two body regions. The first semiconductor region is placed under a succession of a thick silicon oxide layer, a polysilicon layer and a metal layer. A plurality of second lightly doped semiconductor regions of the first conductivity type are placed under said at least two heavily doped body regions and under said first lightly doped semiconductor region of the first conductivity type, each region of said plurality of second lightly doped semiconductor regions of the first conductivity type being separated from the other by portions of said semiconductor layer of the second conductivity type.

10 Claims, 3 Drawing Sheets

Figure 1:
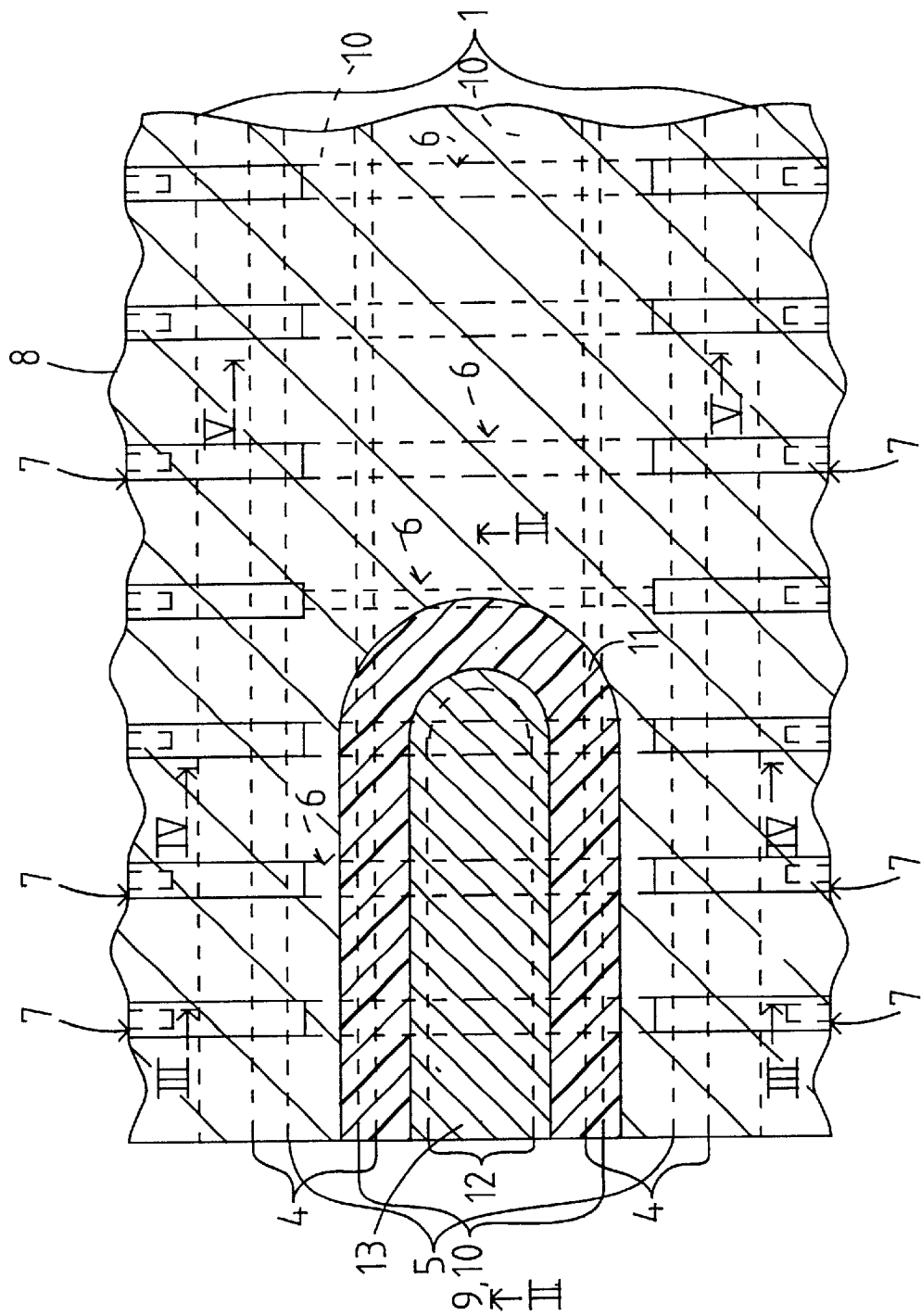
Figure 2:
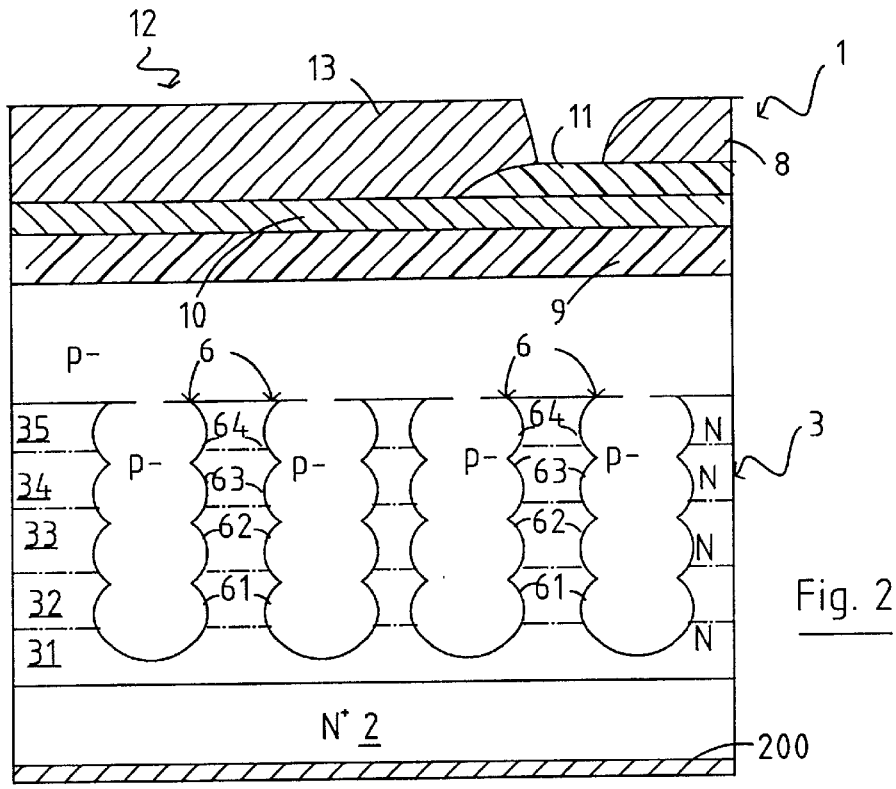
Figure 3:
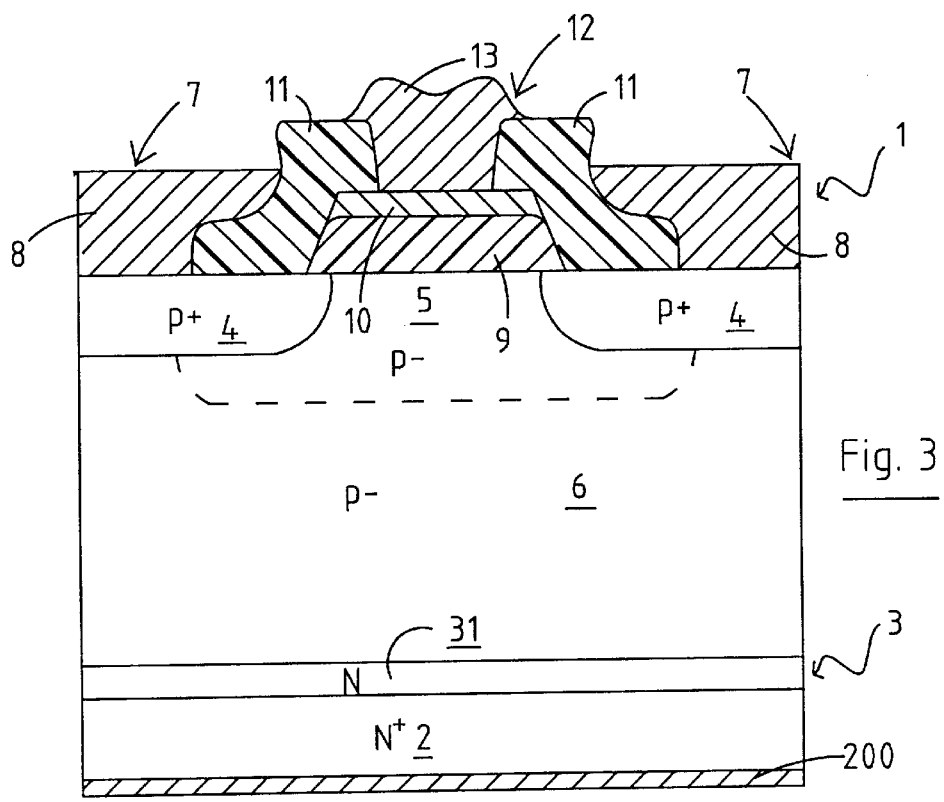
Figure 4:
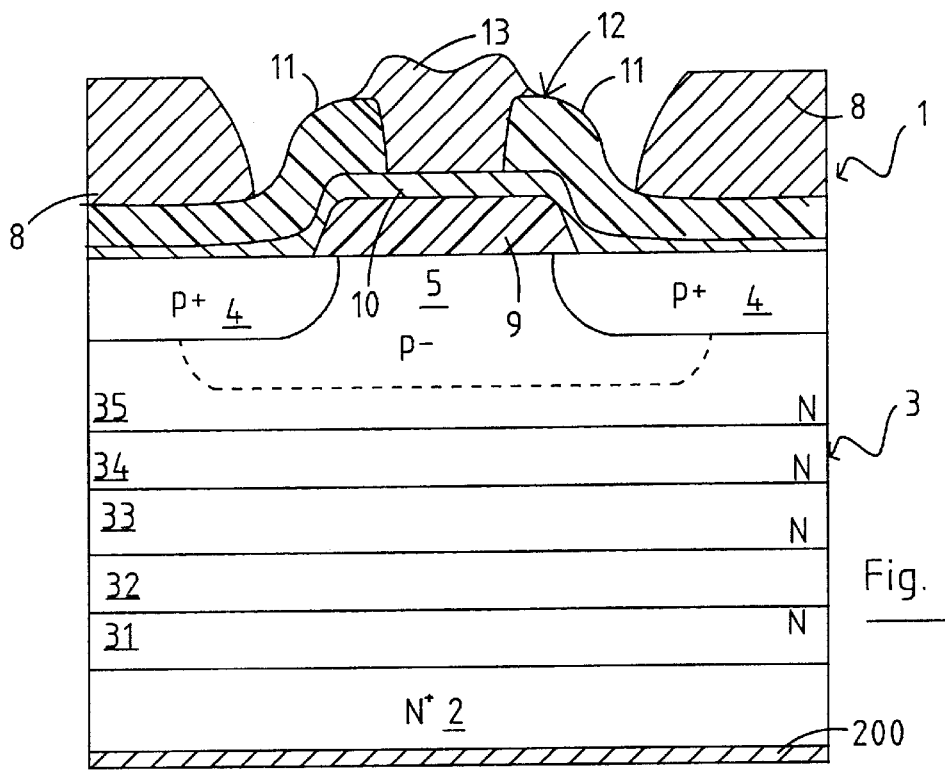
Figure 5:
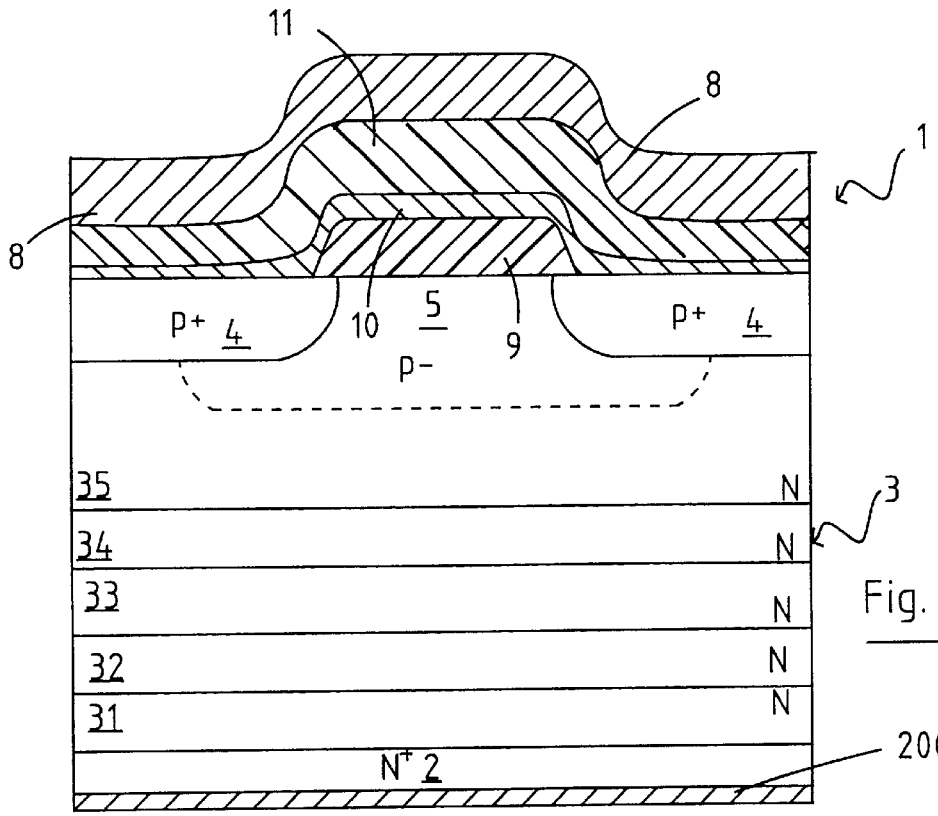

MOS TECHNOLOGY POWER DEVICE

BACKGROUND OF THE INVENTION

1. Field of the invention

The present invention relates to a MOS technology power device, particularly to a MD (Multi Drain) power device.

2. Description of the Related Art

In the design or a power device utilized as a switch switching between on state and off state, the losses in the on state and in the off state must be considered.

The switching time of the device must be reduced in order to reduce the energy dissipated during the switching state. Particularly, the reduction of the intrinsic resistance of the gate of the device assumes a fundamental importance in a MOS technology power device; in fact this allows to reduce the delay of the power device in off state between the turn off imposed by the drive circuit and the effective turn off of the power device.

The reduction of the intrinsic resistance of a MOS power device is made, considering the plant view of the device, by introducing some frames called gate fingers which come into the active area zone of the device and allow the direct contact between the gate metal and the material (for example polysilicon) utilized for transmitting the gate signal of the elementary active units of the device (the MOS units of the power device). In this way the distance between the gate metal and each elementary unit to be switched is reduced so that a suitable reduction of the intrinsic resistance of the device is allowed.

A traditional technology for introducing gate fingers into the traditional MOS power device occurs with a frame wherein the zone, in active area, where the contact between the gate metal and the polysilicon is performed, is protected by a deep body well, a $P^+$ well in the case of a n-channel MOS power device, which prevents the field lines from crowding in the thin oxide thereby avoiding a premature breakdown of the device. The contact between the gate metal and the polysilicon can occur both in proximity of the thin oxide and in proximity of the thick oxide.

However the structures of the above described type cannot be utilized in the case of MD (Multi Drain) MOS power device, wherein, in order to reduce the drain resistivity, columnar extensions of the body wells are introduced by an implant sequence among successive epitaxial growths so as to form the selective drain doping which equilibrates the epitaxially achieved drain charge. Such MD MOS power devices are known from the European patent applications No. 98830737.7 and No. 98830739.3 dated 09.12.1998 of the same Applicant.

BRIEF SUMMARY OF THE INVENTION

In view of the state of the art described, it is an object of the present invention to disclose a MOS technology power device which solves the aforementioned problem.

According to the present invention, such an object is attained by a MOS technology power device comprising a plurality of elementary active units and a part of said power device which is placed between zones where said elementary active units are formed, characterized in that said part of the power device comprises at least two heavily doped body regions of a first conductivity type which are formed in a semiconductor layer of a second conductivity type, a first lightly doped semiconductor region of the first conductivity type which is placed laterally between said two body regions, said first semiconductor region being placed under a succession of a thick silicon oxide layer, a polysilicon layer and a metal layer, and a plurality of second lightly doped semiconductor regions of the first conductivity type being placed under said at least two heavily doped body regions and under said first lightly doped semiconductor region of the first conductivity type, each region of said plurality of second lightly doped semiconductor regions of the first conductivity type being separated from the other by portions of said semiconductor layer of the second conductivity type.

Thanks to the present invention it is possible to form a MOS technology power device, particularly a MD device, wherein the contact between the gate metal and the polysilicon is obtained by means of gate fingers without producing premature breakdown of the device.

BRIEF DESCRIPTION OF THE DRAWINGS

The features and the advantages of the present invention will be made evident by the following detailed description of an embodiment, thereof which is illustrated as not limiting example in the annexed drawings, wherein:

FIG. 1 is a schematic layout of a part of a power device according to present invention;

FIG. 2 is a cross-sectional view of the part of the power device of FIG. 1 along a line II—II;

FIG. 3 is a cross-sectional view of the part of the power device of FIG. 1 along a line III—III;

FIG. 4 is a cross-sectional view of the part of the power device of FIG. 1 along a line IV—IV;

FIG. 5 is a cross-sectional view of the part of the power device of FIG. 1 along a line V—V.

DETAILED DESCRIPTION OF THE INVENTION

Referring to FIGS. 1–5 a part 1 of a n-channel MOS power device according to present invention is shown without a final passivation layer. Said part 1 is interposed between device zones where the elementary active units (the MOS active units) of the power device are performed, in fact considering the layout of FIG. such zones (not shown in figure) are both under and above the part 1. The power device zones, where the elementary active units are performed, are known by the European patent applications No. 98830737.7 and No. 98830739.3 dated Sep. 12, 1998 of the same Applicant. The part 1 of the MOS power device according to invention is a device zone dedicated to the contact between the material (polysilicon) performing the gate structures of the elementary active units of the power device and a metal layer.

Referring to FIGS. 2–5, the part 1 of the power device according to invention comprises a $N^+$ type semiconductor substrate 2 on which a N type semiconductor layer 3 is formed which is constituted by a succession of the N type layers 31–35 which are formed by different epitaxial growths. The layer 3 forms a common drain layer for the elementary active units of the MOS technology power device.

In the layer 3, more specifically in the layer 35, P type conductivity body regions 4 are formed; such body regions 4 are elongated stripes of $P^+$ type heavily doped semiconductor which extend horizontally with respect to FIG. 1, while FIGS. 3–5 are sectional views along a direction transversal to said $P^+$ type semiconductor stripes. Between such two body stripes 4 a $P^-$ type lightly doped semiconductor region 5 is provided which extends for the whole length of the body stripes 4. Under the body regions 4, inside the layer 3, a plurality of P⁻ type lightly doped semiconductor regions 6 is provided which have a column shape and which are separated by portions of the same layer 3, as more shown in FIG. 2. As shown in FIGS. 1–3, such regions 6 are provided only in particular zones of the part 1 of the power device which are vertically delimited by areas 7 where the contact among the body regions 4 and a metal layer 8 occurs; this metal layer 8 is the metallic layer to contact the source regions not shown in the Figures. Also, since the part 1 of the power device is not an elementary active unit, each region 6 is placed both under the two body regions 4 and under the region 5, as can be seen in FIG. 3. Each region 6 has a higher resistivity value than the resistivity value of the layer 3.

Each region 6 is formed by a succession of P⁻ type wells 61–64 which have been formed by means of successive P type dopant implants in the layers 31–34 so that they are alternated with the epitaxial growths of the layers 31–35. In this way, in fact the thermal process forming the MOS device allows the vertical diffusion of each of the wells 61–64 into the corresponding top epitaxial layer of the layers 32–35; this causes the single wells 61–64 to merge for forming P⁻ type columns 6 which extend substantially up to the substrate 2.

A thick silicon oxide layer 9, called field oxide, on which there is a polysilicon layer 10, is provided above the region 5. The polysilicon layer 10 is the same layer which is placed on the thin oxide layers in the elementary active in units of the device for forming the gate structures of the such units. A dielectric layer 11 is provided on the polysilicon layer 10, wherein a substantially central opening 12 is provided to contact the polysilicon layer 10. The opening 12 extends horizontally, looking at FIG. 1, in parallel with the stripes 4 and 5, but it extend up to a certain point and it has a smaller width than the thick silicon oxide layer. Such opening 12 is covered by a metal layer 13 which serves to contact the polysilicon layer 10 which, as aforesaid, represents the polysilicon layer of the gate structures of the elementary active units of the power device. A metallic layer 200 is provided on the bottom surface of the substrate 2.

The layer 5 prevents forming of superficial N type layers in the zone below the layers 9, 10, 13, which could produce canalization phenomenons. Also the presence of the layer 5, which has a dopant concentration equal to that of the region 6, allows to extend to the zone below the layers 9, 10, 13 the capacity to hold voltage even with a high dopant concentration of the layer 3.

Although in the Figures a power device in MOS technology which has a drain layer formed only by five N type layers 31–35 has been disclosed by way of example, it is possible that the drain layer is formed by a number n of N type layers with equal or different dopant concentrations. In this case, instead of a plurality of regions 6 each one formed by a column of four P type semiconductor wells, there will be a plurality of regions 6 each one formed by a column with a number n-1 of P type semiconductor wells.

Also, although a n-channel MOS power device has been described, the same invention can be applied to a p-channel MOS power device.

Preferably each of the body regions 4 is merged with the body regions of each of the elementary active units.

What is claimed is:

1. MOS technology power device comprising a plurality of elementary active units and a part of said power device which is placed between zones where said elementary active units are formed, characterized in that said part of the power device comprises at least two heavily doped body regions of a first conductivity type which are formed in a semiconductor layer of a second conductivity type, a first lightly doped semiconductor region of the first conductivity type which is placed laterally between said two body regions, said first semiconductor region being placed under a succession of a thick silicon oxide layer, a polysilicon layer and a metal layer, and a plurality of second lightly doped semiconductor regions of the first conductivity type being placed under said at least two heavily doped body regions and under said first lightly doped semiconductor region of the first conductivity type, each region of said plurality of second lightly doped semiconductor regions of the first conductivity type being separated from the other by portions of said semiconductor layer of the second conductivity type.

2. Device according to claim 1, characterized in that said metal layer has a smaller width and a smaller length than said thick silicon oxide layer.

3. Device according to claim 1, characterized in that said semiconductor layer of the second conductivity type is formed by a number of superimposed semiconductor layers and said plurality of second lightly doped semiconductor regions of the first conductivity type are a plurality of columns of lightly doped semiconductor regions of the first conductivity type, said columns of semiconductor regions of the first conductivity type being extended substantially to a heavily doped semiconductor substrate of the second conductivity type which is placed under said semiconductor layer of the second conductivity type.

4. Device according to claim 1, characterized in that said at least two heavily doped body regions of the first conductivity type and said first lightly doped semiconductor regions of the first conductivity type are semiconductor stripes.

5. Device according to claim 1, characterized in that said polysilicon layer is the same polysilicon layer forming the gates structures of said elementary active units of said MOS technology power device.

6. Device according to claim 1, characterized in that said first conductivity type is of N type and said second conductivity type is of P type.

7. Device according to claim 1, characterized in that said first conductivity type is of P type and said second conductivity type is of N type.

8. Device according to claim 1, characterized in that said MOS technology power device is a MD power device.

9. Device according to claim 1, characterized in that said semiconductor layer of the second conductivity type is superimposed to a heavily doped semiconductor substrate of the second conductivity type.

10. Device according to claim 1, characterized in that each one of said at least two body regions is merged with body regions of each one of said elementary active units.

* * * * *